United States Patent [19]

Sakamoto et al.

[11] B 4,013,903
[45] Mar. 22, 1977

[54] HIGH SPEED SWITCHING CIRCUIT WHICH REDUCES EFFECT OF MINOR CARRIER STORAGE AND PREVENTS UNDESIRED OSCILLATION

[75] Inventors: Jyunji Sakamoto; Norio Imaizumi; Eisuke Shiratani, all of Gunma, Japan

[73] Assignees: Tokyo Sanyo Electric Co., Ltd.; Sanyo Electric Co., Ltd., Osaka, both of Japan

[22] Filed: Dec. 6, 1974

[21] Appl. No.: 530,285

[44] Published under the second Trial Voluntary Protest Program on April 6, 1976 as document No. B 530,285.

[30] Foreign Application Priority Data

Dec. 7, 1973  Japan ................. 48-143188[U]

[52] U.S. Cl. .................. 307/300; 307/237
[51] Int. Cl.² .............. H03K 3/33; H03K 5/08
[58] Field of Search ............. 307/237, 280, 300

[56] References Cited

UNITED STATES PATENTS

| | | | |
|---|---|---|---|
| 2,887,542 | 5/1959 | Blair et al. | 307/300 |
| 3,010,031 | 11/1961 | Baker | 307/237 |
| 3,534,281 | 10/1970 | Hillhouse | 307/300 |
| 3,710,041 | 1/1973 | Hayashi | 307/300 |

FOREIGN PATENTS OR APPLICATIONS 215,148  11/1957  Australia ................. 307/237

*Primary Examiner*—Stanley D. Miller, Jr.
*Attorney, Agent, or Firm*—Armstrong, Nikaido & Wegner

[57] ABSTRACT

An improved high speed switching circuit having at least an emitter grounded switching transistor, a first resistor connected between the base of said transistor and an input terminal, a second resistor connected between said base and the ground, a plurality of series connected diodes connected between the input terminal and the collector of said transistor has been disclosed. The ratio of the resistance of the first resistor to that of the second resistor is determined in accordance with the number of said series connected diodes.

3 Claims, 3 Drawing Figures

HIGH SPEED SWITCHING CIRCUIT WHICH REDUCES EFFECT OF MINOR CARRIER STORAGE AND PREVENTS UNDESIRED OSCILLATION

BACKGROUND OF THE INVENTION

The present invention relates to a switching circuit in particular, relates to a high speed switching circuit which reduces the effect of hole storage and prevents undesired oscillation.

In a conventional saturation-type switching circuit having an emitter grounded transistor and a resistor between the base of the transistor and the ground, some delay time between an input pulse signal and the corresponding output signal is inevitable due to the presence of the hole storage effect of a transistor.

A Baker clamping circuit has been proposed for overcoming the above disadvantage. However, although said Baker clamping circuit is free from the hole storage effect, it has another disadvantage in that undesired oscillation occurs.

SUMMARY OF THE INVENTION

The general purpose of the present invention is to provide an improved high speed switching circuit.

One object, therefore, of the present invention is to overcome the disadvantages of prior switching circuits by providing a switching circuit which reduces the hole storage effect and prevents undesirable oscillation.

The above and other objects are attained by a switching circuit having at least an emitter grounded switching transistor, a first resistor connected between the base of said transistor and an input terminal, a second resistor connected between said base and the ground, a plurality of series connected diodes connected between the input terminal and the collector of said transistor. The ratio of the resistance of the first resistor to that of the second resistor is determined in accordance with the number of said series connected diodes.

BRIEF DESCRIPTION OF THE DRAWINGS

The foregoing and other objects, features and attendant advantages of the present invention will be better understood by the accompanying drawings wherein.

DETAILED EXPLANATION OF THE PREFERRED EMBODIMENT

First, the prior Baker clamping circuit will be explained with reference to FIG. 1 in order to better understand the present invention.

Figure 1:
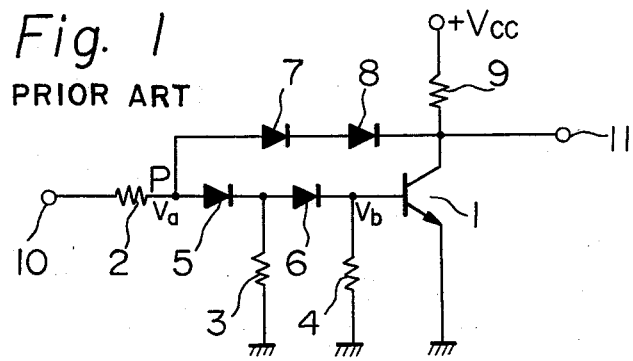
FIG. 1 is a circuit diagram of a prior switching circuit.

In FIG. 1, reference number 1 is a switching transistor, 2 is an input resistor, 3 and 4 are base resistors, 5 and 6 are base diodes, 7 and 8 are resistors for preventing the saturation of said transistor 1, 9 is a load resistor, 10 is an input terminal and 11 is an output terminal. It is assumed that the current amplification factor $h_{FE}$ of the transistor 1 is sufficiently large, and the saturation voltage $V_{BE(SAT)}$ between the base and the emitter of the transistor 1 is the same as the forward voltage drop $V_f$ of each diode.

When a positive pulse $V_i$ is applied to the input terminal 10, the current flows through the collector of the transistor 1. At that time, the potential $V_a$ at point P is the sum of the forward voltage drop $V_a$ of the diodes 5 and 6, and the saturation voltage $V_{BE(SAT)}$ of the transistor 1, so $V_a$ is expressed;

$$V_a = 3 V_f$$

In FIG. 1, the output voltage of $V_o$ at the output terminal 11 is not less than $V_f$. If said output voltage $V_o$ is apt to be less than $V_f$, the diodes 7 and 8 are conducted and the current of the resistor 2 is by passed through the diodes 7 and 8 to the collector of the transistor 1. Therefore, the base potential of the transistor 1 is prevented from increasing. Accordingly, the voltage $V_{CE}$ between the collector and the emitter of said transistor 1, or the output voltage $V_o$, is maintained at $V_f$. That is to say, the transistor 1 is not saturated.

Figure 3:
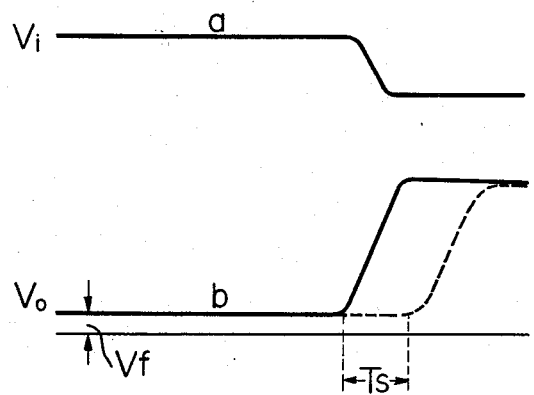
FIG. 3 shows the curves of an input waveform and an output waveform of the present switching circuit.

Since the transistor 1 is not saturated, it can avoid the hole storage time $T_s$ due to the hole storage effect, and high speed switching characteristics can be obtained as shown in FIG. 3, wherein a curve (a) is an input waveform, a curve (b) is an output waveform, and $T_s$ is the hole storage time if the circuit suffers from the hole storage effect.

However, the circuit in FIG. 1 has the disadvantage of high frequency operation. In high frequency operation the collector voltage of the transistor 1 is fed back to the base of the same through the diodes 7, 8, 5 and 6. Since the capacitance of the diodes 5 and 6, and the resistance of the resistors 3 and 4 compose a differentiation circuit, the phase shift occurs in the base voltage of the transistor 1. Therefore, the transistor 1 sometimes oscillates undesirably.

Figure 2:
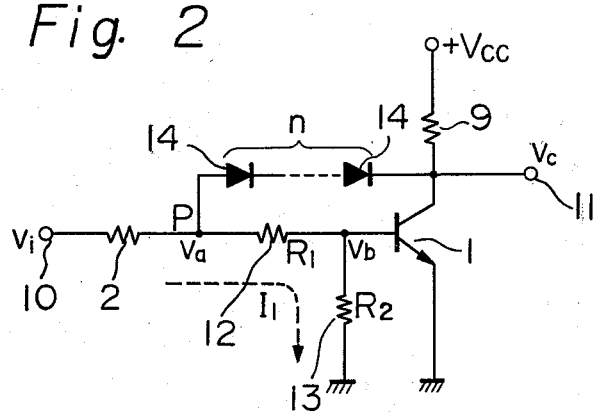
FIG. 2 is a circuit diagram of a switching circuit according to the present invention.

FIG. 2 shows a circuit diagram of the improved high speed switching circuit according to the present invention, which overcomes the above-mentioned drawback. In FIG. 2, reference numbers 1 is a switching transistor, 2 is an input resistor connected between an input terminal 10 and an intermediate point P, 9 is a load resistor, 11 is an output terminal connected to the collector of said transistor of resistance $R_1$ connected between the intermediate point P and the base of said transistor 1, and 13 is also a resistor of resistance $R_2$ connected between the base of said transistor 1 and the ground. A plurality of series connected diodes 14 are connected between the intermediate point P and the collector of the transistor 1.

First, it is assumed that the saturation voltage $V_{BE(SAT)}$ between the base and the emitter of the transistor 1 is the same as the forward voltage drop of each diode, there is only one diode 14, and the value of the resistance $R_1$ is the same as the value of the resistance $R_2$.

When a positive pulse signal $V_i$ is applied to the input terminal 10, the base voltage $V_b$ of the transistor 1 is expressed;

$$V_b = V_{BE(SAT)}$$
$$= V_f$$
$$= I_1 R_2$$

where $I_1$ is a value of current (flowing the resistor 12). The base current of the transistor 1 is very small and can be neglected. At that case, the current $I_1$, in the resistor 12 is the same as that in the resistor 13, and the potential $V_a$ at the intermediate point P is expressed;

$$V_a = (R_1 + R_2)I_1$$
$$= 2R_1I_1 = 2R_2I_2$$
$$= 2V_f$$

The output voltage $V_o$ is expressed;

$$V_o = V_a - V_f$$
$$= 2V_f - V_f$$
$$= V_f$$

Therefore, the transistor 1 in FIG. 2 is not saturated, the reason of which is the same as that explained before in accordance with FIG. 1. Since the transistor 1 in FIG. 2 is not saturated, it does not suffer from the hole storage effect, and the high speed switching characteristics shown in curves $a$ and $b$ in FIG. 3 can be obtained.

Further, since the circuit in FIG. 2 does not have a capacitance in the base circuit of the transistor 1, neither phase shift nor undesirable oscillation occurs.

In an actual circuit, the number of diodes 14 is designed with respect to the breakdown voltage in backward direction of the diode. If the value of said breakdown voltage is one $n$'th of the source voltage $V_{cc}$, $n$ number of diodes must be used in series connection. At that time, the ratio of $R_1$ and $R_2$ must satisfy $$R_1 = nR_2.$$

Finally, some of the specific effects of the present invention are listed below.

a. The number of diodes in FIG. 2 can be reduced compared with the number in FIG. 1, since the circuit in FIG. 2 has no diodes in the base circuit.
b. The delay due to the hole storage effect can be completely avoided.
c. In the formula $v_b = I_1R_1 = V_f$, the value of $V_b$ follows the change of $V_f$ due to temperature change. Therefore, the change of the ambient temperature affects the characteristics of the circuit very little.
d. The present circuit is suitable for use in an intergrated circuit (IC).

From the foregoing it will now be apparent that a new and improved switching circuit has been found. If should be understood, of course, that the embodiment disclosed is merely illustrative and is not intended to limit the scope of the invention. Reference should be made to the appended claims, therefore, rather than to the specification as indicative of the scope of the invention.

What is claimed is:

1. A switching circuit comprising a transistor whose emitter is grounded, a load connected in the collector circuit of said transistor, a first resistor, the value of resistance of which is $R_1$, being connected between an input point and the base of said transistor, a second resistor, the value of resistance of which is $R_2$, being connected between the base of said transistor and the ground, at least one diode connected between said input point and the collector of said transistor, and an output terminal connected to the collector of the transistor.

2. A switching circuit accordingly to claim 1, wherein the ratio $R_2{}^R{}_1$ is $n$, where $n$ is the number of said diodes.

3. A switching circuit according to claim 2, wherein said ratio $R_2{}^R{}_1$ is 1 and $n$ is 1.

* * * * *